(12) United States Patent
Kim

(10) Patent No.: US 7,449,764 B2
(45) Date of Patent: Nov. 11, 2008

(54) SEMICONDUCTOR DEVICE AND METHOD OF MANUFACTURING THE SAME

(75) Inventor: Bo-sung Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 69 days.

(21) Appl. No.: 11/649,484

(22) Filed: Jan. 4, 2007

(65) Prior Publication Data

US 2007/0181968 A1    Aug. 9, 2007

(30) Foreign Application Priority Data

Feb. 7, 2006   (KR)   ...................... 10-2006-0011572

(51) Int. Cl.
 *H01L 29/00* (2006.01)
(52) U.S. Cl. ................. 257/529; 257/209; 257/E21.592
(58) Field of Classification Search ................. 257/529, 257/209, E21.592
See application file for complete search history.

(56) References Cited

U.S. PATENT DOCUMENTS 6,822,309 B2    11/2004   Hirota

FOREIGN PATENT DOCUMENTS

JP    2000-349155    12/2000
KR    1020040008706 A    1/2004

*Primary Examiner*—Evan Pert
*Assistant Examiner*—Tan N Tran
(74) *Attorney, Agent, or Firm*—Mills & Onello LLP

(57) ABSTRACT

Provided are a semiconductor device which substantially prevents repair failure and a method of manufacturing the same. The semiconductor device includes a plurality of first fuses formed apart from each other on a semiconductor substrate, and on which a protective layer is formed; a first insulating layer filled in between the first fuses and configured to expose the protective layer; a plurality of second fuses formed between the first fuses and on the first insulating layer; and a second insulating layer formed on the first insulating layer, wherein the second insulating layer includes a fuse window configured to fully expose the second fuses and the protective layer formed on the first fuses.

6 Claims, 10 Drawing Sheets

SEMICONDUCTOR DEVICE AND METHOD OF MANUFACTURING THE SAME

CROSS-REFERENCE TO RELATED APPLICATION

This application claims priority under 35 U.S.C. § 119 to Korean Patent Application No. 10-2006-0011572 filed on Feb. 7, 2006 in the Korean Intellectual Property Office, the disclosure of which is incorporated herein by reference in its entirety.

BACKGROUND OF THE INVENTION

1. Field of the Invention

The present invention relates to a semiconductor device and method of manufacturing the same. More particularly, the present invention relates to a semiconductor device and method of manufacturing the same that can prevent repair failure.

2. Description of the Related Art

A semiconductor device is manufactured by executing a fabrication ("FAB") process, in which integrated circuits comprised of cells are formed on a wafer using pre-defined circuit patterns, and an assembly process, in which the wafer is packaged in units of a chip.

Electrical Die Sorting (EDS), which is used to inspect electrical characteristics, is performed between the fabrication process and the assembly process.

Defective cells are sorted by inspecting their electrical characteristics. Sorted defective cells are replaced with redundant cells, which are already made, by performing a repair process, so the chip can operate normally. Therefore, semiconductor device yields can be improved.

The repair process is performed by cutting a wiring region connected to the defective cell with a laser beam. The wire cut by the laser beam is called a fuse, and a region in which fuses are closely packed is called a fuse region.

The fuse region is formed while word lines and bit lines of semiconductor device cells are formed. If fuses are formed at word lines or bit lines that are located at a lower region of a semiconductor device due to increasing integration of semiconductor devices, etching depth is increased during the fuse opening process. Thus, a metal interconnection or a conductive layer of a capacitor electrode located at an upper region is used as the fuse.

If the pitch of fuses is increased in order to prevent bridging from occurring between the fuses, the area of the fuse region is increased. On the other hand, if the pitch of fuses is decreased, an adjacent fuse can be damaged during fuse cutting, and bridging can occur between adjacent fuses due to fuse residue after fuse cutting. Due to the ever increasing integration of semiconductor memory devices, fuse problems are a continuing concern. Thus, repair failure is increased, and semiconductor device reliability is decreased.

SUMMARY OF THE INVENTION

According to aspects of the present invention, provided is a semiconductor device which substantially prevents repair failure and a method of manufacturing the semiconductor device.

According to an aspect of the present invention, there is provided a semiconductor device including a plurality of first fuses formed apart from each other on a semiconductor substrate, and a protective layer formed on the plurality of fuses, a first insulating layer which fills in between the first fuses and is configured to expose the protective layer, a plurality of second fuses formed between the first fuses and on the first insulating layer, and a second insulating layer formed on the first insulating layer, wherein the second insulating layer includes a fuse window configured to fully expose the second fuses and the protective layer formed on the first fuses.

In the semiconductor device, the protective layer can comprise a nitride layer.

The first fuses and the second fuses can comprise a metal.

The first fuses can have a stacked structure comprising a barrier layer, a metal layer, and a capping layer.

The second fuses can have a stacked structure comprising a barrier layer and a metal layer.

The semiconductor can further comprise a guard ring formed around the fuse window.

According to another aspect of the present invention, there is provided a semiconductor device including a plurality of first fuses formed apart from each other on a semiconductor substrate, a protective layer conformally formed on the semiconductor substrate on which the first fuses are formed, a first insulating layer filled in between the first fuses and configured to expose the protective layer on the first fuses, a plurality of second fuses formed between the first fuses and on the first insulating layer, and a second insulating layer formed on the first insulating layer, wherein the second insulating layer includes a fuse window configured to fully expose the second fuses and the protective layer formed on the first fuses.

In the semiconductor, the protective layer can comprise a nitride layer.

The first fuses and the second fuses can comprise a metal.

The first fuses can have a stacked structure comprising a barrier layer, a metal layer, and a capping layer.

The second fuses can have a stacked structure comprising a barrier layer and a metal layer.

The semiconductor device can further comprise a guard ring formed around the fuse window and configured to prevent moisture absorption.

According to still another aspect of the present invention, there is provided a method of fabricating a semiconductor device, the method including forming on a semiconductor substrate a plurality of first fuses disposed apart from each other and forming a protective layer on the first fuses, forming a first insulating layer which covers the first fuses, forming a plurality of second fuses on the first insulating layer between the first fuses, forming a second insulating layer which covers the second fuses, and sequentially etching the second insulating layer and the first insulating layer, whereby a fuse window is formed that exposes the second fuses and the protective layer formed on the first fuses.

In the method, the forming of the first fuses on which the protective layer is formed can comprise sequentially forming a barrier layer, a metal layer, a capping layer, and a nitride layer on the first insulating layer and patterning the barrier layer, the metal layer, the capping layer, and the nitride layer.

The forming of the second fuses can comprise sequentially forming a barrier layer, a metal layer, and a capping layer on the second insulating layer and patterning the barrier layer, the metal layer, and the capping layer.

The method can further comprise forming a guard ring around the fuse window configured to prevent moisture absorption.

According to a further aspect of the present invention, there is provided a method of fabricating a semiconductor device, the method including forming a plurality of first fuses disposed apart from each other, conformally forming a protective layer on the semiconductor substrate on which the first fuses are formed, forming a first insulating layer on the protective layer, forming a plurality of second fuses between the first fuses on the first insulating layer, forming a second insulating layer which covers the second fuses, and sequentially etching the second insulating layer and the first insulating layer, whereby a fuse window is formed that exposes the plurality of second fuses and the protective layer on the first fuses.

In the method, the forming of the first fuses and the forming of the second fuses can comprise sequentially forming a barrier layer, a metal layer, and a capping layer on the first insulating layer and patterning the barrier layer, the metal layer, and the capping layer.

The protective layer can comprise a nitride layer.

The method can further comprise forming a guard ring around the fuse window configured to prevent moisture absorption.

BRIEF DESCRIPTION OF THE DRAWINGS

Various aspects of the invention will become more apparent in view of the attached drawing figures, which are provided by way of example, not by way of limitation, wherein like elements are represented by like reference numerals, which are given by way of illustration only and thus do not limit the example embodiments of the present invention, wherein.

DETAILED DESCRIPTION OF THE INVENTION

Figure 1:
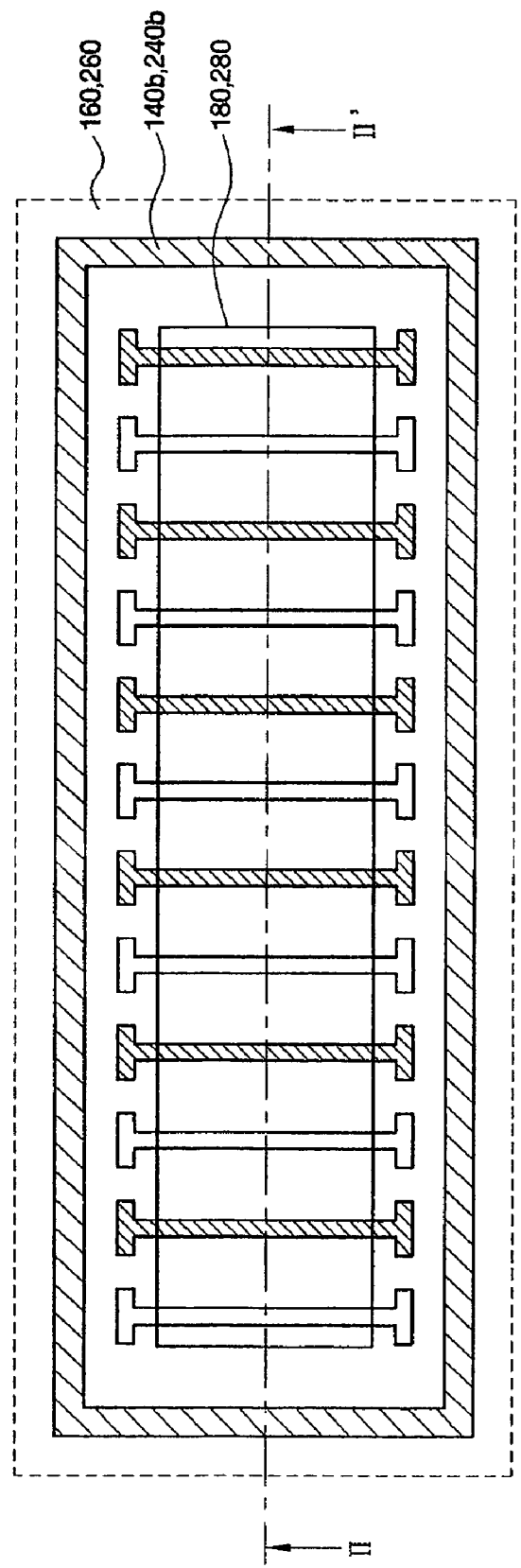
FIG. 1 is a plan view illustrating an embodiment of a semiconductor device according to aspects of the present invention.

Advantages and features of the present invention may be understood more readily by reference to the following detailed description of preferred exemplary embodiments and the accompanying drawings. The present invention may, however, be embodied in many different forms and should not be construed as being limited to the embodiments set forth herein. In the drawings, the shape and thickness of layers and regions are exaggerated for clarity, and the proportions thereof may not be to scale.

The exemplary embodiment of the present invention will be described with illustrations such as sectional views and/or plan views. The illustration can be modified according to a fabricating technology and/or a permitted limitation of error. Therefore, the exemplary embodiments of the present invention are not limited by the illustrations, and include variation of shapes according to the fabrication process. For example, etch regions illustrated as having right angles may have a round shape or a curved shape. Therefore, regions shown in the figures are illustrated in schematic forms, and the shapes of the illustrated regions in the figures are presented simply by way of illustration and not as a limitation.

It will be understood that, although the terms first, second, etc. can be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Hereinafter, a structure of the semiconductor device and the method of manufacturing the same will be described with reference to FIGS. 1 through 5.

Figure 2:
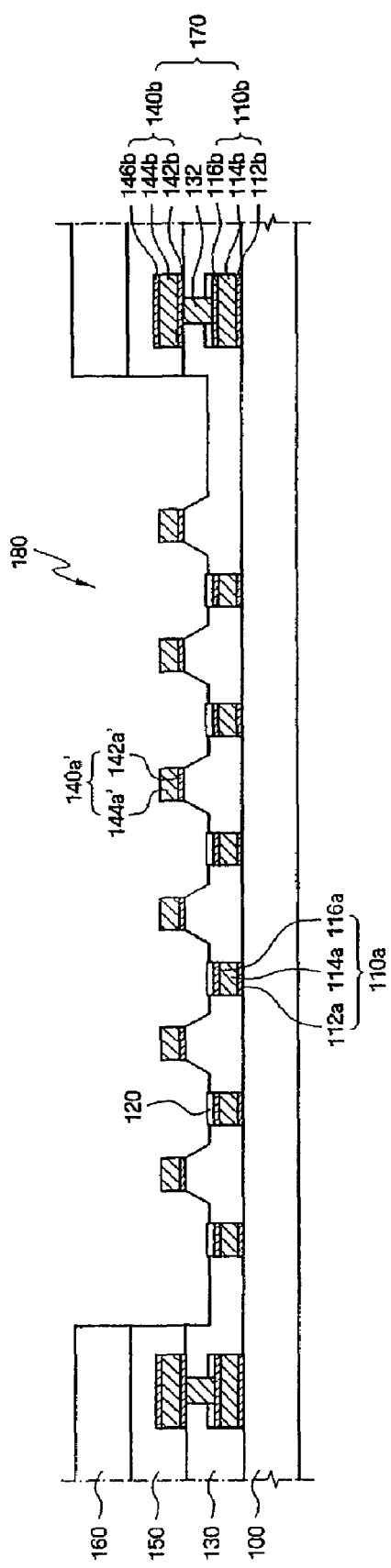
FIG. 2 is a sectional view of an embodiment of the semiconductor device of FIG. 1 taken along a line I-II', according to an aspect of the present invention.

FIG. 1 is a plan view illustrating an embodiment of a semiconductor device according to aspects of the present invention. FIG. 2 is a sectional view of an embodiment of the semiconductor device of FIG. 1 taken along a line I-II', according to an aspect of the present invention.

As shown in FIGS. 1 and 2, a first insulating layer 130 and a second insulating layer 150 are stacked on a fuse region of a semiconductor substrate 100. Though not shown, in various embodiments a plurality of insulating layers can be located under the first insulating layer 130. The plurality of insulating layers (130, 150) can be formed of an oxide layer comprising BPSG (Boronphosphorous silicate glass), PSG (Phosphorous silicate glass), SOG (Spin On Glass), or TEOS (Tetra-ethyl-ortho-silicate), as examples. A passivation layer 160 comprising a nitride layer is formed on the uppermost insulating layer 150.

A plurality of first fuses 110a which are formed apart from each other are located in a fuse region of the semiconductor substrate 100. The first fuses 110a may be located at a layer on which a wire (not shown) of a semiconductor cell region is formed.

The first fuses 110a, which have a linear shape in this embodiment, are arranged at substantially regular intervals in parallel with each other, and the first fuses 110a are formed of metal. In detail, the first fuses 110a have a stacked structure comprising a barrier layer 112a, a metal layer 114a and a capping layer 116a. The metal layer 114a can be formed of aluminum (Al), tungsten (W), or copper (Cu), as examples, and each of the barrier layer 112a and the capping layer 116a can have a stacked structure comprising a titanium (Ti) layer and a titanium nitride (TiN) layer, as examples.

A protective layer 120 is located on the first fuses 110a. The protective layer 120 is an etch stop layer used during formation of a fuse window 180 and protects the first fuses 110a during cutting of second fuses 140a', which are located at an upper region. The protective layer 120 can be a nitride layer, and the thickness of the protective layer 120 can be adjusted such that the protective layer 120 can be cut during laser cutting of the first fuses 110a.

The first insulating layer 130, which fills gaps between each of the plurality of first fuses 110a and exposes the protective layer 120 on the first fuses 110a, is located on the semiconductor substrate 100.

The second fuses 140a' are formed on regions of the first insulating layer 130 located between the first fuses 110a. The second fuses 140a' are formed in parallel with the lower first fuses 110a and have a stacked structure comprising a barrier layer 142a' and a metal layer 144a'. That is, the first fuse 110a and the second fuse 140a' are disposed in the lower region and the upper region, respectively, and are alternately arranged with each other along the substrate 100.

The second insulating layer 150 is located on the first insulating layer 130, and the fuse window 180, which exposes the second fuses 140a' and the protective layer 120 on the first fuses 110a, is formed in the second insulating layer 150. Therefore, a laser can be radiated into the fuse window 180 during the repair process.

A guard ring 170 is formed around the fuse window 180, so moisture absorption through the fuse window 180 can be prevented. The guard ring comprises a first guard ring pattern 110b, which is coplanar with the first fuses 110a, a second guard ring pattern 140b, which is coplanar with the second fuses 140a', and a guard ring contact 132, which connects the first guard ring pattern 110b and the second guard ring pattern 140b. The first guard ring pattern 110b has a stacked structure comprising a barrier layer 112b, a metal layer 114b and a capping layer 116b.

The protective layer 120 is formed on the first fuses 110a, so the protective layer 120 prevents the first fuses 110a, which are adjacent to the second fuses 140a', from being damaged when the second fuses 140a' are cut. Even when by-products are scattered during the cutting of the second fuse 140a', bridging can be prevented because the protective layer 120 is located on the first fuses 110a.

Hereinafter, an exemplary embodiment of a method of fabricating a semiconductor device according to aspects of the present invention will be described with reference to FIGS. 3 through 5 and FIG. 2.

Figure 3:
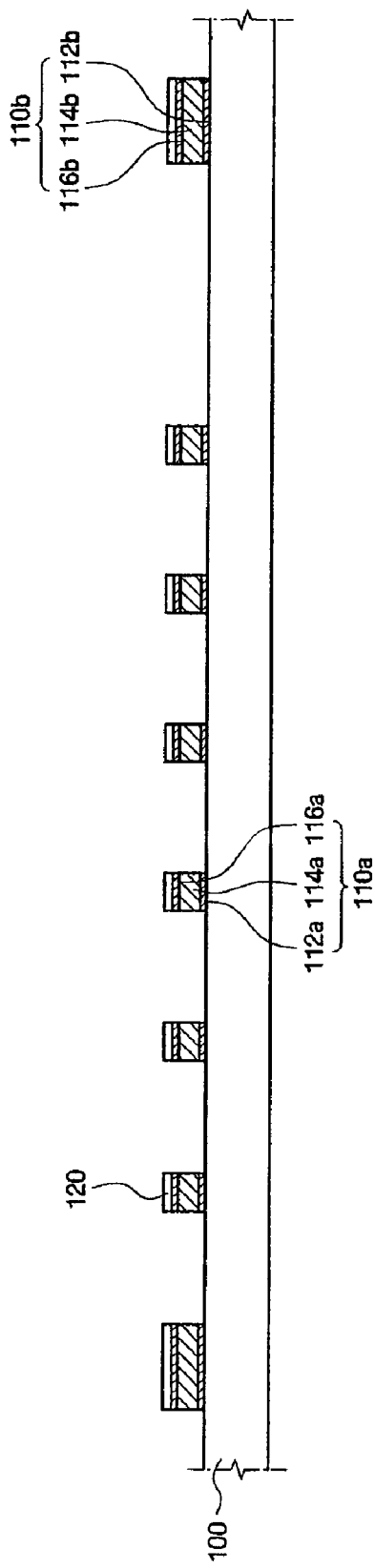
FIGS. 3 through 5 are sectional views sequentially illustrating an embodiment of a method of fabricating a semiconductor device according to aspects of the present invention.
Figure 4:
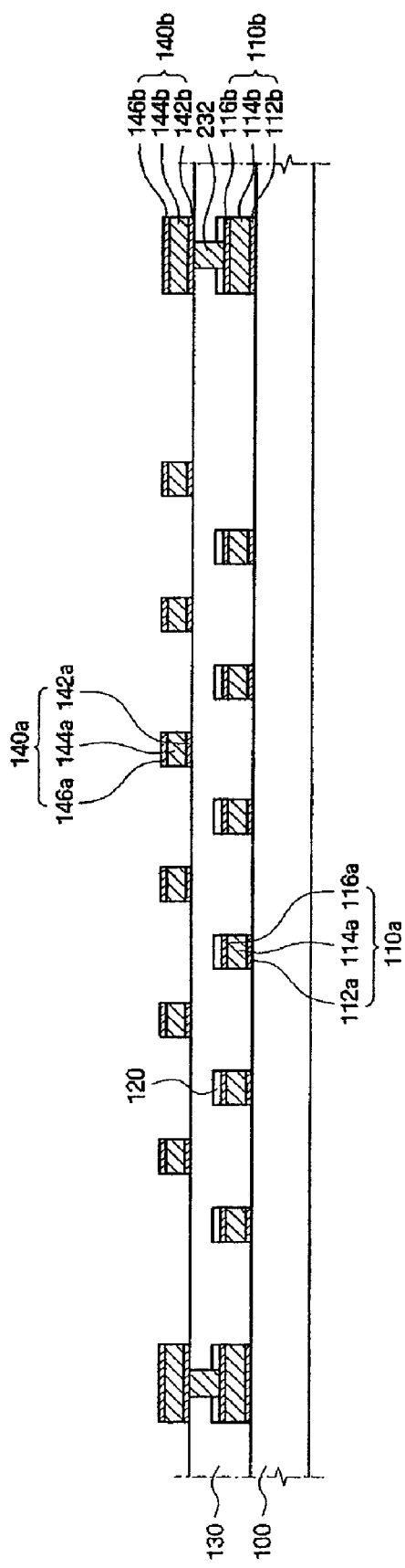
Figure 5:
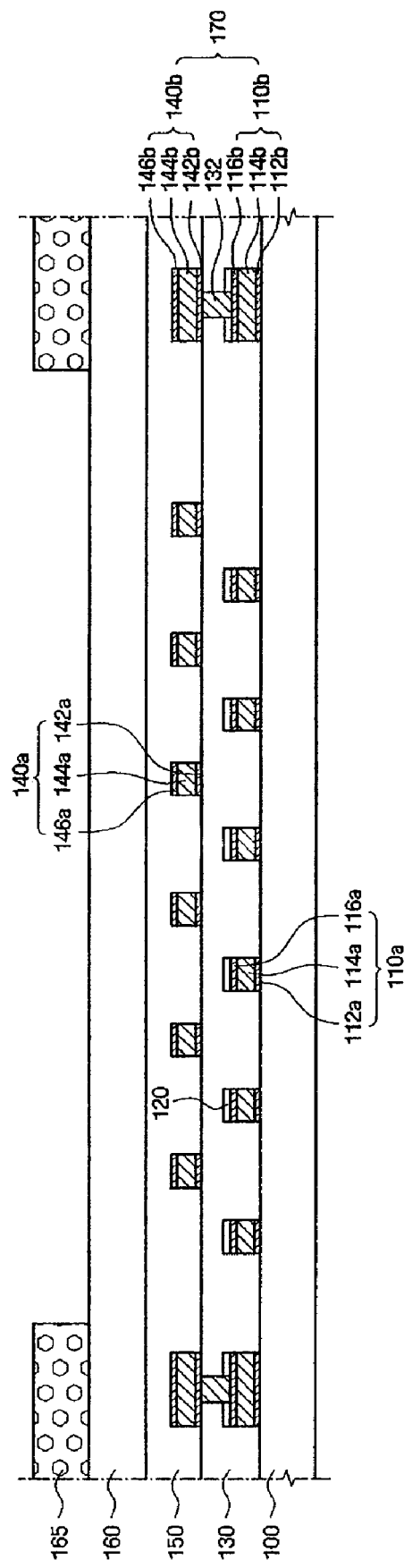

FIGS. 3 through 5 are sectional views sequentially illustrating an embodiment of a method of fabricating a semiconductor device according to aspects of the present invention.

As shown in FIG. 3, the barrier layer 112a, metal layer 114a and capping layer 116a are sequentially formed on the semiconductor substrate 100. The barrier layer 112a and the capping layer 116a prevent diffusion or oxidation of metal of the metal layer 114a and can be formed of aluminum (Al), tungsten (W), or copper (Cu), as examples.

Then, a protective layer 120, which is used as an etch stopper layer during formation of a fuse window 180 and protects first fuses 110a during cutting of second fuses 140a', is formed on the capping layer 116a. The protective layer 120 can be formed by nitride deposition, and is formed to a thickness which allows the protective layer 120 to be cut during laser cutting of the first fuses 110a.

In order to form the first fuses 110a and a first guard ring pattern 110b, a mask (not shown) is formed on the protective layer 120 and patterned. Thus, the first fuses 110a which are disposed apart from each other at substantially predetermined intervals, are arranged in parallel with each other, and have the protective layer 120 formed thereon, are completed. Also, the guard ring pattern 110b, which has the same stacked structure as the first fuses 110a, is formed around the first fuses 110a.

As shown in FIG. 4, the first insulating layer 130 is formed on the semiconductor substrate 100 on which the first fuses 110a are formed in order to fill gaps between the first fuses 110a. The first insulating layer 130 is formed by performing oxide deposition over the entire surface of the semiconductor substrate 100, and by planarization. After a contact hole which exposes the upper region of a first guard ring pattern 110b is formed in the first insulating layer 130, conductive material is filled into the hole. Therefore, a guard ring contact 132 is formed.

Then, the barrier layer 142a, metal layer 144a, and capping layer 146a are sequentially stacked on the first insulating layer, and patterned, thus forming second fuses 140a and the second guard ring pattern 140b. The second fuses 140a are located on regions of the first insulating layer 130 located between the first fuses 110a, which are under the second fuses 140a, and are formed in parallel with the first fuses 110a. Also, the second guard ring pattern 140b is formed around the second fuses 140a, and is connected with the guard ring contact 132, which is under the second guard ring pattern 140b.

As shown in FIG. 5, the second insulating layer 150, which covers the second fuses 140a and the second guard ring pattern 140b, is formed on the first insulating layer 130. A passivation layer 160 can be formed on the second insulating layer 150 by nitride deposition.

Then, a mask 165 is formed in order to form the fuse window 180 which exposes the first fuses 110a and the second fuses 140a. The mask 165 exposes the passivation layer 160 over the first fuses 110a and the second fuses 140a.

Then, a part of the passivation layer 160, a part of the second insulating layer 150, and a part of the first insulating layer 130 are etched with the mask 165. The first insulating layer 130 is etched until the protective layer 120 is exposed and the protective layer 120 on the first fuses 110a is used as an etch stopper. When the fuse window 180 is formed, an upper region of the second fuses 140a, that is, part of the capping layer 146a and the metal layer 144a, can be etched due to over etching. As shown in FIG. 2, the fuse window 180 which fully exposes the second fuses 140a' and exposes the protective layer 120 on the first fuses 110a is formed.

Hereinafter, the structure of another exemplary embodiment of the a semiconductor device and a method of manufacturing the same will be described with reference to FIG. 1 and FIGS. 6 through 10.

Figure 6:
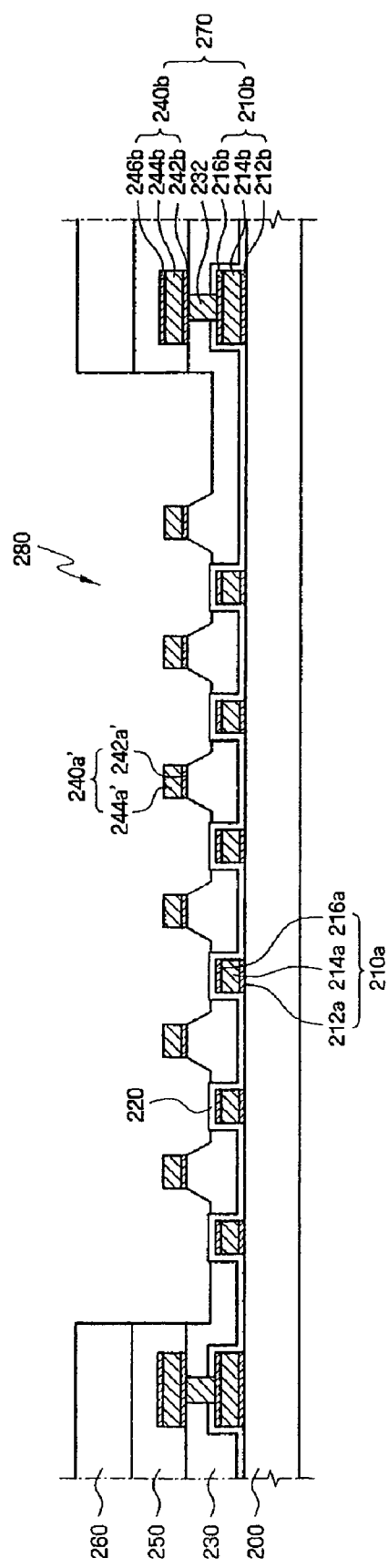
FIG. 6 is a sectional view of another embodiment of the semiconductor device of claim 1 taken along the line I-II', according to another aspect of the present invention.

FIG. 6 is a sectional view of another embodiment of the semiconductor device of FIG. 1 taken along a line I-II', according to another aspect of the present invention.

As shown in FIGS. 1 and 6, first fuses 210a, which comprise a barrier layer 212a, a metal layer 214a and a capping layer 216a, are stacked on a fuse region of a semiconductor substrate 200, and the first fuses 210a are arranged apart from each other at predetermined intervals and arranged in parallel with each other. The barrier layer 212a and the capping layer 216a are formed of a refractory metal or a refractory metal compound. For example, each of the barrier layer 212a and the capping layer 216a can have a stacked structure comprising a titanium (Ti) layer and a titanium nitride (TiN) layer. Also, the metal layer 214a can be formed of aluminum (Al), tungsten (W), or copper (Cu), as examples.

A protective layer 220 is conformally formed on the semiconductor substrate 200 and on the first fuses 210a formed on the semiconductor substrate 200. The protective layer 220 can be formed of nitride, and the thickness of the protective layer 220 can be adjusted such that the protective layer 220 can be cut during laser cutting of the first fuses 210a. The protective layer 220 prevents the first fuses 210a from being damaged when the second fuses 240a' are cut. Also, bridging can be prevented due to by-products which are produced during cutting of the second fuses 240a'. Further, exposure of the first fuses 210a due to over etching during formation of a fuse window 280 can be prevented.

A first insulating layer 230 which exposes the protective layer 220 on the first fuses 210a is located on the protective layer 220 between the first fuses 210a. That is, the first insulating layer 230 fills between the first fuses 210a.

The second fuses 240a' are formed on the first insulating layer 230. The second fuses 240a' are formed in parallel with the first fuses 210a, which are under the second fuses 240a', and each of the second fuses 240a' is a stacked structure comprised of a barrier layer 242a' and a metal layer 244a'. That is, the first fuses 210a and the second fuses 240a' are located in a lower region and an upper region, respectively, and are alternately arranged with each other along the substrate 200.

A second insulating layer 250 is located on the first insulating layer 230, and a fuse window 280 which exposes the second fuses 240a' and the protective layer 220 on the first fuses 210a is formed in the second insulating layer 250. Therefore, a laser can be radiated into the fuse window 180 during a repair process.

A guard ring 270 is formed around the fuse window 280, so moisture absorption through the fuse window 280 can be prevented. The guard ring 270 comprises a first guard ring pattern 210b which is coplanar with the first fuses 210a, a second guard ring pattern 240b which is coplanar with the second fuses 240a', and a guard ring contact 232 which connects the first guard ring pattern 210b and the second guard ring pattern 240b. The first guard ring pattern 210b has a stacked structure comprising a barrier layer 212b, a metal layer 214b and a capping layer 216b.

The protective layer 220 is formed according to a surface of the first fuses 210a, so the protective layer 220 prevents the first fuses 210a, which are adjacent to the second fuses 240a', from being damaged when the second fuses 240a' are cut. Even though by-products are scattered during the cutting of the second fuse 240a', bridging can be prevented because the protective layer 220 is located on the surface of first fuses 210a.

Hereinafter, another exemplary embodiment of a method of fabricating a semiconductor device according to aspects of the present invention will be described with reference to FIGS. 7 through 10.

Figure 7:
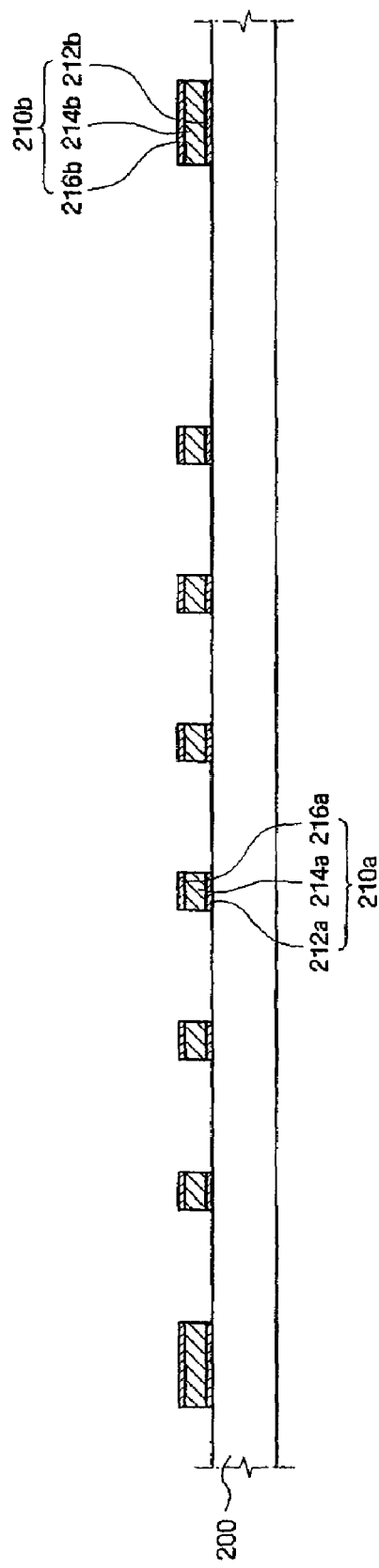
FIGS. 7 through 10 are sectional views sequentially illustrating another embodiment of a method of fabricating a semiconductor device according to another aspect of the present invention.

As shown in FIG. 7, the barrier layer 212a, metal layer 214a, and capping layer 216a are sequentially stacked on a fuse region of a semiconductor substrate 200. The barrier layer 212a and the capping layer 216a are formed of a refractory metal or a refractory metal compound. For example, each of the barrier layer 212a and the capping layer 216a can have a stacked structure comprising a titanium (Ti) layer and a titanium nitride (TiN) layer. Also, the metal layer 214a can be formed of aluminum (Al), tungsten (W), or copper (Cu), as examples.

Figure 8:
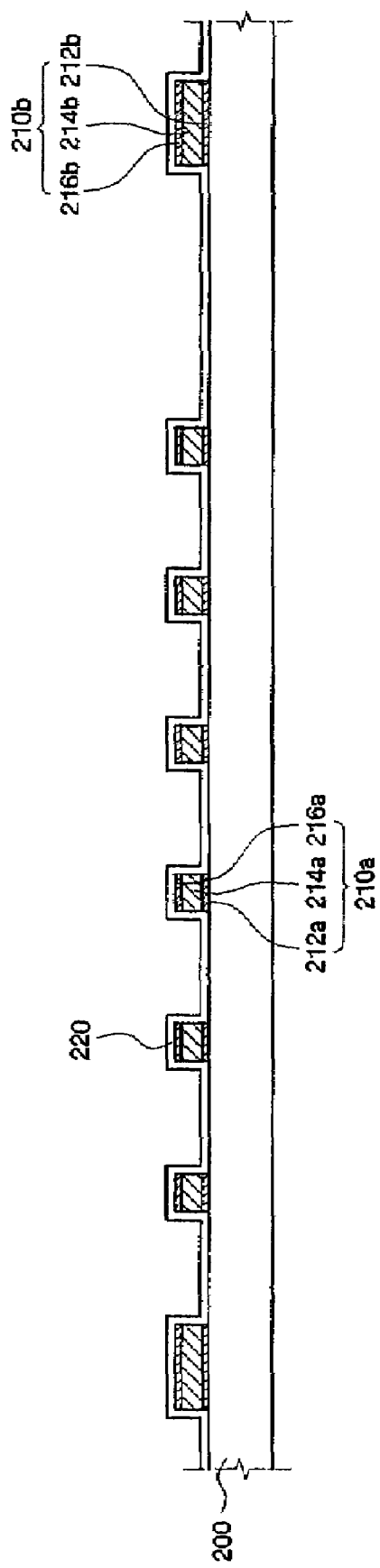

As shown in FIG. 8, in order to form the first fuses 210a and the first guard ring pattern 210b, a mask (not shown) is formed on the capping layer 216a. The protective layer 220 can be formed by nitride deposition, and is formed to a thickness which allows the protective layer 220 to be cut during laser cutting of the first fuses 210a. The protective layer 220 protects the first fuses 210a during laser cutting of second fuses 240a', which are formed on the first fuses 210a, and prevents bridging.

Figure 9:
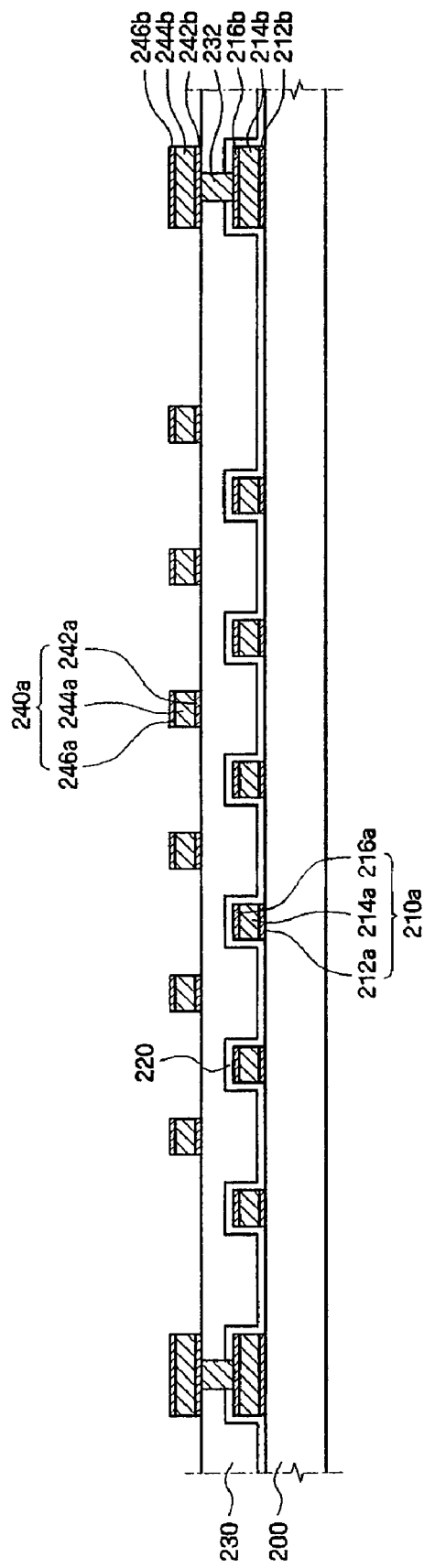

As shown in FIG. 9, the first insulating layer 230 is deposited on the protective layer 220 and planarized. Oxide, such as BPSG (Boronphosphorous silicate glass), PSG (phosphorous silicate glass), SOG (Spin On Glass), TEOS (Tetra Ethyl Ortho Silicate), and so on, can be deposited as an insulating material.

After the first insulating layer 230 is formed, a contact hole which exposes an upper surface of the first guard ring pattern 210b is formed, and conductive material is filled into the contact hole. Therefore, a guard ring contact 232 is formed.

Then, the barrier layer 242a, metal layer 244a, and capping layer 246a are stacked on the first insulating layer 230, which covers the first fuses 210a and the guard ring pattern 210b and in which the guard ring contact 232 is formed. The barrier layer 242a, the metal layer 244a, and the capping layer 246a are patterned to form second fuses 240a, which are alternately arranged with the first fuses 210a under the second fuses 240a. A guard ring pattern 240b connected to the guard ring contact 232 is formed.

Figure 10:
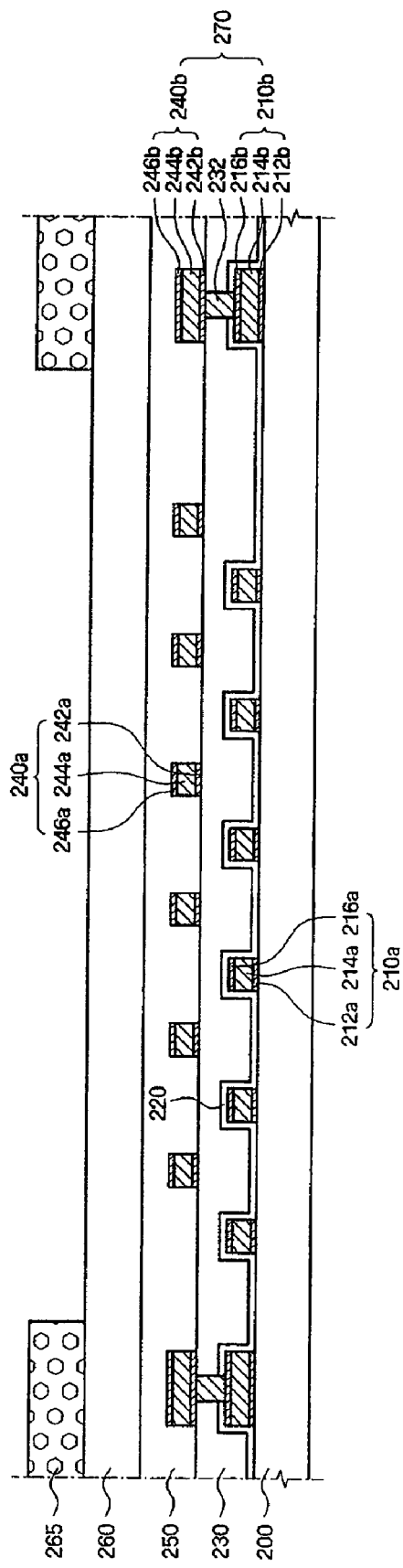

As shown in FIG. 10, a second insulating layer 250, which covers the second fuses 240a and the second guard ring pattern 240b, is formed on the first insulating layer 230. A passivation layer 260 can be formed on the second insulating layer 250 by nitride deposition.

Then, a mask 265 is formed in order to form a fuse window 280 which exposes the first fuses 210a and the second fuses 240a. The mask 265 exposes the passivation layer 260 over the first fuses 210a and the second fuses 240a.

Then, a part of the passivation layer 260, a part of the second insulating layer 250, and a part of the first insulating layer 230 are etched with the mask 265. The first insulating layer 230 is etched until the protective layer 220 on the first fuses 210a is exposed, thus completing the fuse window 280 which fully exposes the second fuses 240a and the protective layer 220 on the first fuses 210a. By performing over etching when the fuse window 280 is formed, part of the capping layer 246a and part of the metal layer 244a of the second fuses 240a can be etched. Because the first fuses 210a are covered with the protective layer 220, the first fuses 210a are not exposed by the fuse window 280. When the first fuses 210a are cut, the protective layer 220 is cut by a laser beam in order to cut the first fuses 210a.

While aspects of the present invention have been particularly shown and described with reference to exemplary embodiments thereof, it will be apparent to those skilled in the art that the scope of the invention is given by the appended claims, rather than the preceding description, and all variations and equivalents which fall within the range of the claims are intended to be embraced therein. Therefore, it should be understood that the above embodiments are not limitative, but illustrative in all aspects.

As described above, in the semiconductor device and method of manufacturing the same, fuses are formed on a plurality of layers, and the upper and the lower fuses are arranged alternately. Therefore, bridging due to reduction of pitch between fuses, which occurs as a design rule shrinks, can be substantially prevented.

Because the protective layer is formed on the fuses of the lower region, damage to the fuses of the lower region can be substantially prevented when fuses in an upper region are cut.

Also, bridging of adjacent fuses due to by-products occurring during cutting of the fuses of the upper region can be substantially prevented.

What is claimed is:

1. A semiconductor device comprising:
   a plurality of first fuses formed apart from each other on a semiconductor substrate, and a protective layer formed on the plurality of first fuses;
   a first insulating layer filled in between the first fuses and configured to expose the protective layer;
   a plurality of second fuses formed between the first fuses and on the first insulating layer; and
   a second insulating layer formed on the first insulating layer, wherein the second insulating layer includes a fuse window configured to fully expose the second fuses and the protective layer formed on the first fuses.

2. The semiconductor device of claim 1, wherein the protective layer comprises a nitride layer.

3. The semiconductor device of claim 1, wherein the first fuses and the second fuses comprise a metal.

4. The semiconductor device of claim 1, wherein the first fuses are a stacked structure comprising a barrier layer, a metal layer, and a capping layer.

5. The semiconductor device of claim 1, wherein the second fuses are a stacked structure comprising a barrier layer and a metal layer.

6. The semiconductor device of claim 1, further comprising a guard ring formed around the fuse window.

* * * * *